(12) United States Patent
Baco

(10) Patent No.: US 6,892,171 B2
(45) Date of Patent: May 10, 2005

(54) METHOD FOR MODELING A REFLECTED ELECTRICAL WAVE IN A DIGITAL SIMULATION

(75) Inventor: Joseph C. Baco, Cameron Park, CA (US)

(73) Assignee: Intel Corporation, Santa Clara, CA (US)

(*) Notice: Subject to any disclaimer, the term of this patent is extended or adjusted under 35 U.S.C. 154(b) by 351 days.

(21) Appl. No.: 09/793,969

(22) Filed: Feb. 28, 2001

(65) Prior Publication Data

US 2002/0161564 A1 Oct. 31, 2002

(51) Int. Cl.⁷ .............................................. G06F 17/50
(52) U.S. Cl. .............................................. 703/13; 716/4
(58) Field of Search ........................... 703/13, 14, 21, 703/15; 716/4, 17; 714/724; 326/30, 53, 56, 57, 58; 717/124

(56) References Cited

U.S. PATENT DOCUMENTS

| | | | | |
|---|---|---|---|---|
| 5,589,776 A | * | 12/1996 | Morant | 324/534 |
| 5,881,267 A | * | 3/1999 | Dearth et al. | 703/27 |
| 6,067,596 A | * | 5/2000 | Nguyen et al. | 710/129 |
| 6,141,631 A | * | 10/2000 | Blinne et al. | 703/14 |
| 6,212,490 B1 | * | 4/2001 | Li et al. | 703/14 |
| 6,297,663 B1 | * | 10/2001 | Matsuoka et al. | 326/30 |
| 6,420,899 B1 | * | 7/2002 | Crittenden et al. | 326/30 |
| 6,480,817 B1 | * | 11/2002 | Peters et al. | 703/15 |
| 6,496,037 B1 | * | 12/2002 | Bertin et al. | 326/82 |
| 6,501,293 B2 | * | 12/2002 | Braceras et al. | 326/30 |
| 6,657,966 B1 | * | 12/2003 | Kramarczyk et al. | 370/241 |

OTHER PUBLICATIONS

U.S. patent application publication US 2002/0049576 A1, issued to Meyer, Steven.*
U.S. patent application publication US 2003/0208717 A1, issued to Klotchkov et al.*
U.S. patent application publication No. 2003/0115568 A1, issued to Miller et al., on Jun. 2003.*

* cited by examiner

Primary Examiner—Thai Phan
(74) Attorney, Agent, or Firm—Schwegman, Lundberg, Woessner & Kluth, P.A.

(57) ABSTRACT

A computer-based simulation system comprises a hardware model of a hardware interface having a transmission line; a test bench; and a simulator configured to simulate the operation of the hardware model based on the test bench for functional validation, including representing a reflected wave in a digital simulation to recognize the presence of a peripheral device at the opposite end of a transmission line.

26 Claims, 5 Drawing Sheets

METHOD FOR MODELING A REFLECTED ELECTRICAL WAVE IN A DIGITAL SIMULATION

TECHNICAL FIELD

The present invention relates to integrated circuit or chip design and simulation in digital systems, and more particularly, relates to a method for modeling a reflected electrical wave in a digital simulation.

BACKGROUND

Design automation for integrated circuits (ICs), particularly application specific integrated circuits (ASICs) or entire digital systems on single chipsets, is becoming increasingly important as the integrated circuits (ICs) become more complex and dense. Design modeling, layout and verification of these integrated circuits (ICs), for example, are becoming more complex and time intensive. A broad range of design tools may be used to generate and analyze models of an intended system for design mistakes prior to fabrication. A typical tool suite may include behavioral languages and simulators (e.g., analog and digital simulators) used to model and simulate the operation of integrated circuits (ICs) or complete digital systems at many different levels of abstraction.

Behavioral languages may include Hardware Description Languages (HDLs) used to describe a piece of hardware for the purposes of simulation, modeling, testing, creation and documentation of designs. Popular Hardware Description Languages (HDLs) are Verilog and Very-High-Speed Integrated Circuit HDL (VHDL) developed for the Department of Defense and subsequently standardized by the Institute of Electrical & Electronics Engineering (IEEE). Other Hardware Description Languages include, but are not limited to, a Hardware Programming Language (AHPL), Computer Design Language (CDL), Consensus Language (CONLAN), Interactive Design Language (IDL), Instruction Set Processor Specification (ISPS), Test Generation and Simulation (TEGAS), Texas Instrument Hardware Description Language (TI-HDL), and Toshiba Description Language (TDL). However, such HDLs are typically not designed for verification. Therefore, a test bench that includes interfaced HDL programming, C or C++ programming, and various scripts, is typically required to simulate and verify the correctness of an HDL hardware model.

For complex chipset or digital system designs, VDHL simulations are preferred methods of verification of operational correctness and performance characteristics of complex integrated circuits or other electronic components or interface mechanisms in the chipset, such as Universal Serial Bus (USB) hubs for supporting multiple peripheral devices simultaneously, such as printers, scanners, digital cameras, modems, network adapters, tape drives, CD/DVD drives, hard disk drives and computer devices.

In many high speed digital signal interfaces such as USB interfaces of a chipset, the physical transmission medium consists of a wire (or bundle of wires), that is terminated on both ends with matched series or parallel termination resistance. The laws of physics dictate that a mis-match in termination resistance at the ends of the transmission line will result in an electrical reflection on the wire that occurs when a transmitted electrical signal is "bounced" off of the opposite end of a transmission cable from which it originated. This property may be used in some modern high-speed interfaces to recognize the presence (or lack of presence) of a peripheral device at the opposite end of a transmission cable.

In the past, analog simulators have been utilized to provide a continuous time function so as to evaluate the physical reflected wave response of the hardware model. However, evaluation at this level has been compute time intensive and impractical for VHDL functional validation. Digital simulators have also been used to model the reflected wave phenomenon. However, previous modeling of such a reflected wave phenomenon in a digital simulation has been limited to more obscure and intrusive methods of injecting simulation values directly into core logic.

Accordingly, there is a need for obtaining a more effective simulation of the properties of interest (the transmission line reflections) of a hardware model. In other words, there is a need for a method of representing the reflected wave phenomenon efficiently in a digital simulation for functional validation purposes.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable for use with all types of computer systems, digital systems, peripheral devices, host bridges and chipsets, including chipsets with I/O controller hubs (ICH1, ICH2 and ICH3) and PCI 64-bit hubs (P64Hs) and follow-on products, and new chipsets having digital logic incorporated therein which may become available as computer technology develops in the future. However, for the sake of simplicity, discussions will concentrate mainly on exemplary use of a computer system for modeling transmission line reflections in digital simulation, although the scope of the present invention is not limited thereto.

Figure 1:
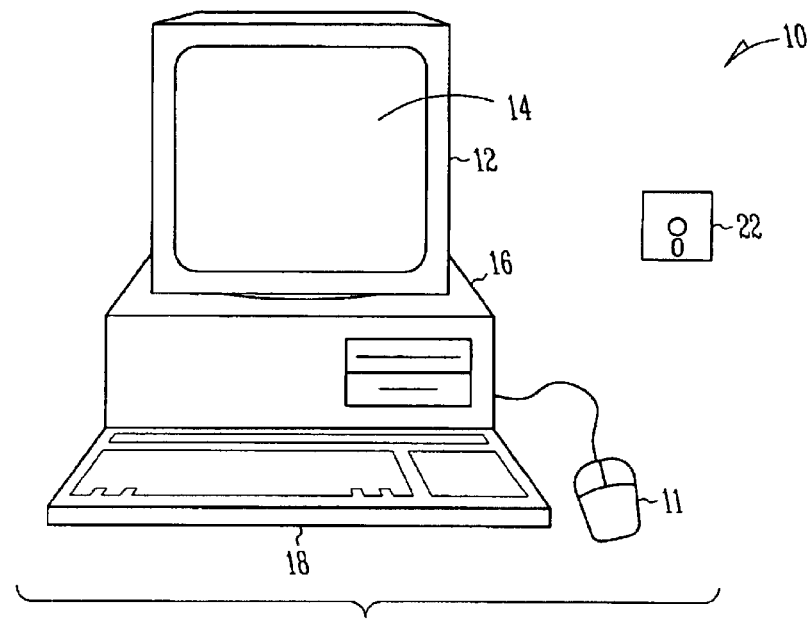
FIG. 1 illustrates an example computer system used to execute software for designing and simulating the behavior of a hardware model.

Attention now is directed to the drawings and particularly to FIG. 1, an example computer system 10 used to execute computer programs for designing and simulating the behavior of a hardware model (chip design) using hardware description languages such as Verilog and VHDL. Such a host computer system 10 may correspond to a workstation, a server, a personal computer (PC) running Windows.T.M., a Macintosh.TM. computer or another computer system. As shown in FIG. 1, the host computer system 10 comprises a display device 12 including a screen 14, a housing cabinet 16, an input device such as a keyboard 18, and a mouse 11 including one or more buttons such as mouse buttons. Housing cabinet 16 houses a floppy disk drive or a CD-ROM drive which may be utilized to store and retrieve computer programs including code that incorporates the present invention, data files for use with the present invention, and the like. While a floppy disk 22 is shown as a computer readable medium, other computer readable media including CD-ROM, tape, DRAM, hard disks, and flash memory may be utilized. Housing cabinet 16 also houses familiar computer components (not shown) such as a processor, memory, hard disk drives, and the like.

Figure 2:
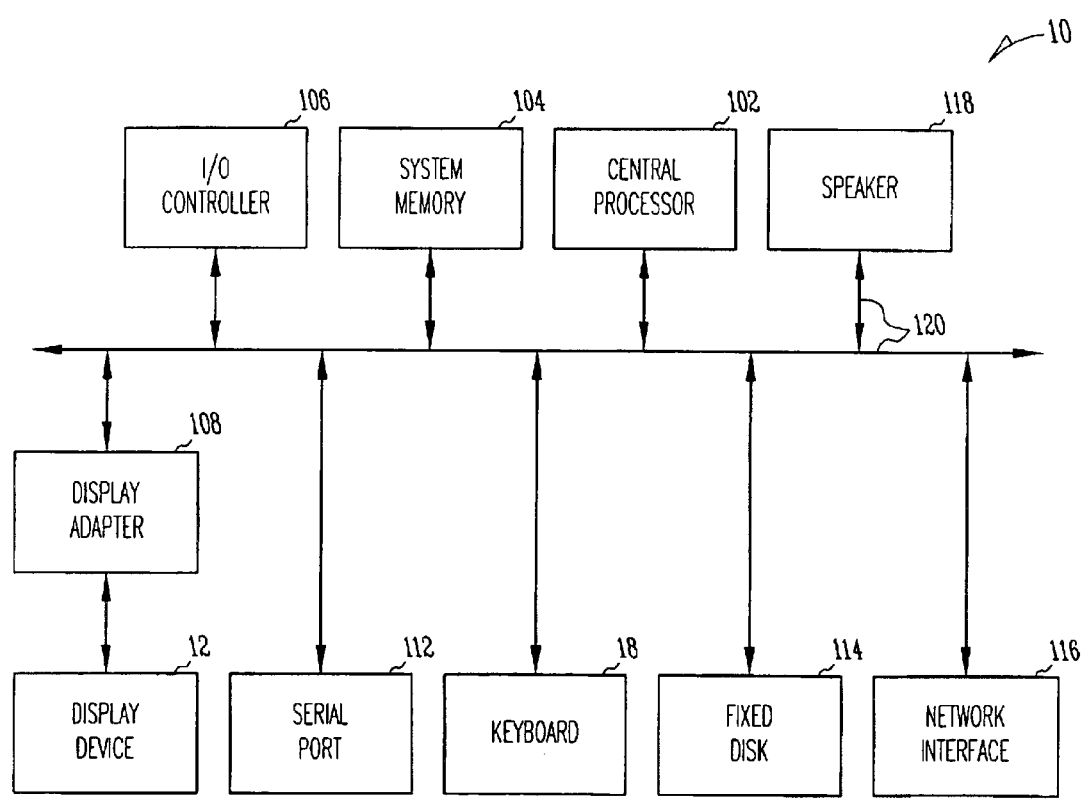
FIG. 2 illustrates an example block diagram of a computer system used to execute software for designing and simulating the behavior of a hardware model.

FIG. 2 illustrates a system block diagram of an example computer system 10 used to execute computer programs for designing and simulating the behavior of a hardware model (chip design). The computer system 10 further includes, but is not limited to, subsystems such as a central processor 102, a system memory 104, an I/O controller 106, a display adapter 108, a serial port 112, a disk 114, a network interface 116, and a speaker 118. Other computer systems suitable may also include additional or fewer subsystems. For example, another computer system could include more than one processor 102 (i.e., a multi-processor system) or a system may include a cache memory. Arrows such as 120 represent the system bus architecture of the computer system 10. However, these arrows are illustrative of any interconnection scheme serving to link the subsystems. For example, speaker 118 may be connected to the other subsystems through a port or have an internal direct connection to the central processor 102.

Figure 3:
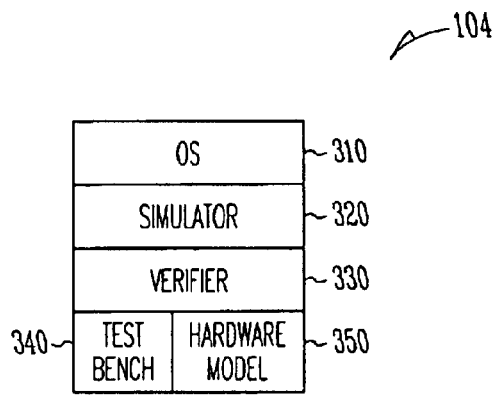
FIG. 3 illustrates an architectural view of an example simulator system according to an embodiment of the present invention.
Figure 4:
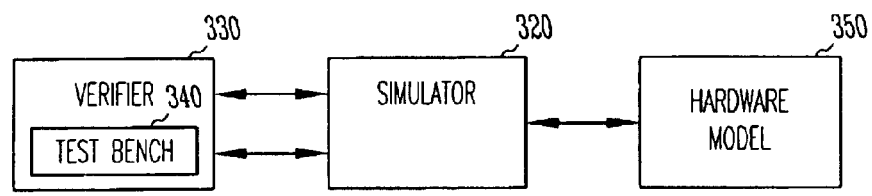
FIG. 4 illustrates a system level view of an example simulator system according to an embodiment of the present invention.

As shown in FIGS. 3 and 4, the system memory 104 may include a random access memory (RAM), a read only memory (ROM) or another storage device for storing an operating system (OS) 310 and a simulation system including a simulator 320, a simulation verifier 330, a test bench 340, and a hardware model 350 which are executed by the central processor 102 (FIG. 2) for simulations of a hardware model 350 for functional validation purposes. The simulation system may be a software module configured for digital simulation and verification of the behavior of a hardware model 350. Such software module may be written using hardware description languages such as Verilog or VHDL, and may be provided on a computer tangible medium, such as memory devices; magnetic disks (fixed, floppy, and removable); other magnetic media such as magnetic tapes; optical media such as CD-ROM disks, or via Internet downloads, which may be available for plug-in or download into an existing operating system (OS).

The test bench 340 represents a software program written in any language for the purposes of exercising and verifying the functional correctness of a hardware model 350 during simulation in a simulation environment. Typically, the test bench 340 is normally written in the same HDL language as the hardware model 350 to perform any operation, sequence of operations and/or combinations of operations that the verifier 330 is capable of performing. While a test bench 340 can be simple or complex and the set of all possible operations is fairly diverse, the primary functions of a test bench are: to specify input signal waveforms to be used by the simulator 320; to specify operational correctness and performance criteria; and to specify operations to be performed by the simulator 320, when the operational correctness and performance criteria are satisfied by the simulation verifier 330. The term "waveform" may indicate a sequence of values associated with a signal over a period of time, or equivalently, a sequence of one or more changes in value of a signal over a period of time.

The hardware model 350 represents a software representation of a hardware design, such as an integrated circuit (IC), an application specific integrated circuit (ASIC) or an entire digital system on a single chipset, for example, an I/O controller hub (e.g., ICH1, ICH2 and ICH3) or a PCI 64-bit hub (P64H). According to an embodiment of the present invention, such a hardware model 350 may correspond to transmission line reflections in high speed digital signal interfaces such as USB interfaces so as to recognize the presence (or lack of presence) of a peripheral device at the opposite end of a transmission cable. Simulation may be viewed on a display device 12 of the host computer-based simulation system 10 shown in FIGS. 1–2. A graphical user interface (GUI) may be utilized to permit the user to direct and control the simulation.

Figure 5:
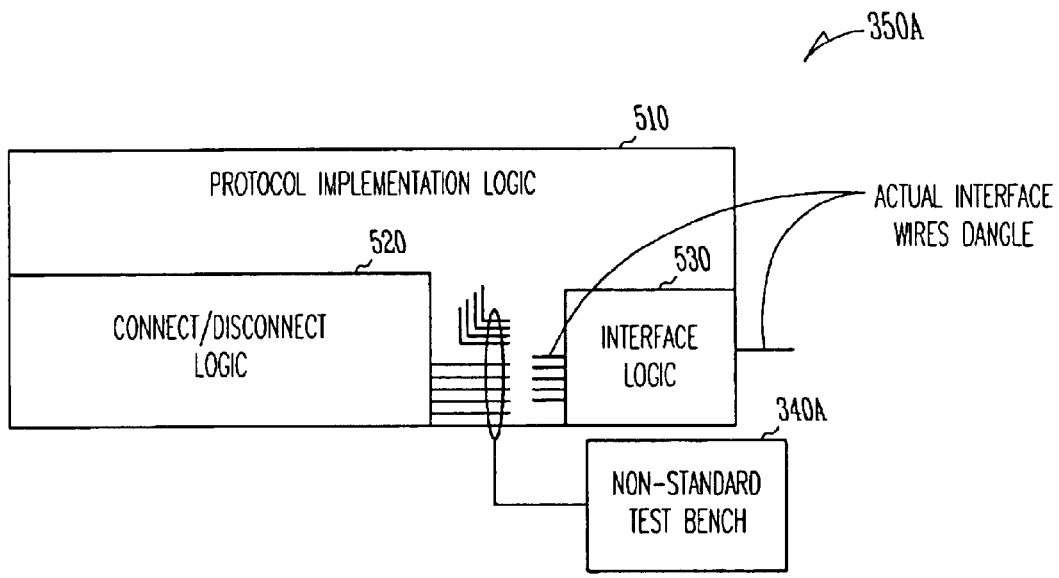
FIG. 5 illustrates an example digital simulation prior to reflected wave modeling technique.

In prior digital simulations of a reflected wave phenomenon used in modern high-speed digital signal interfaces (e.g., USB interfaces) to recognize the presence (or lack of presence) of a peripheral device at the opposite end of a transmission line, modeling of such a reflected wave phenomenon is limited to more obscure and intrusive methods of injecting simulation values directly into core logic. For example, FIG. 5 illustrates an example digital simulation of a hardware model 350A prior to reflected wave modeling technique according to an embodiment of the present invention. As shown in FIG. 5, the hardware model 350A may be uniquely configured in terms of protocol implementation logic 510, connect/disconnect logic 520 and interface logic 530 for digital simulation of transmission line reflections. The protocol implementation logic 510 may be digital logic programmed to implement the communication scheme and protocol of the particular hardware design. For example, if the high speed interfaces correspond to USB interfaces, then the USB protocol needs to be implemented. The connect/disconnect logic 520 may be digital logic programmed to perform validation. The interface logic 530 may be analog logic configured to translate electrical behaviors of the transmission line into digital values for functional validation purposes.

However, in prior digital simulations of a reflected wave phenomenon, the connect/disconnect logic 520 that directly controls the transmission line would have been "disconnected" in the simulation. An external (non-standard) test bench 340A would then be used in place of the actual interface logic 530 to create the condition of a reflected wave. As a result, this modeling technique leaves the actual interface logic model out of the digital simulation and thus validation coverage is near zero in that area. In addition, the interface logic 530 of the chip design would then be simulated in a separate analog simulation under a small subset of the simulation state space.

Figure 6:
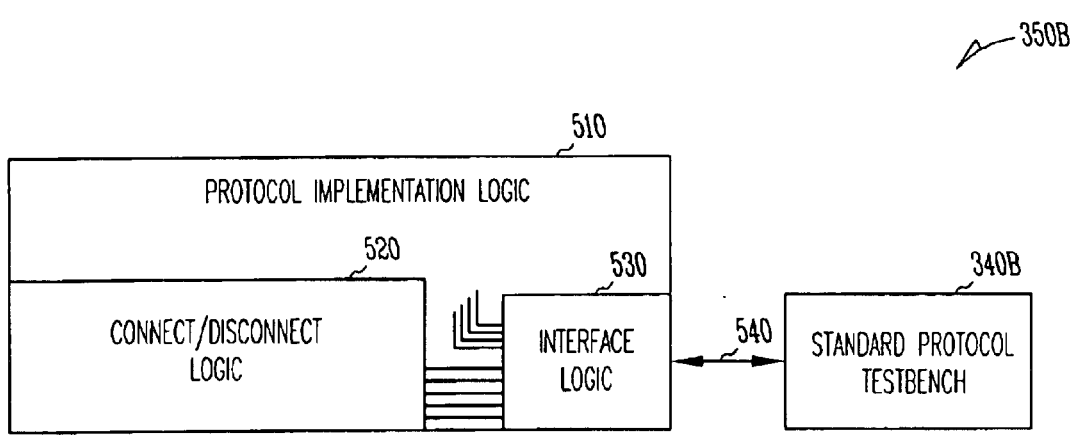
FIG. 6 illustrates an example digital simulation with reflected wave modeling technique according to an embodiment of the present invention.

Turning now to FIG. 6, an example digital simulation with the reflected wave modeling technique according to an embodiment of the present invention is illustrated. As shown in FIG. 6, a hardware model 350B may also be configured in terms of protocol implementation logic 510, connect/disconnect logic 520 and interface logic 530. However, the reflected wave modeling technique according to an embodiment of the present invention is utilized to simulate the behavior of the transmission line reflections. Standard protocol test bench 340B may be connected directly to the interface logic 530, via transmission line 540. In this simulation, the test bench 340B that implements the target protocol can be used to obtain full validation coverage of the interface logic 530. Modification to the protocol implementation logic 510 is not required and thus the overall fidelity of the simulation is improved significantly.

Figure 7:
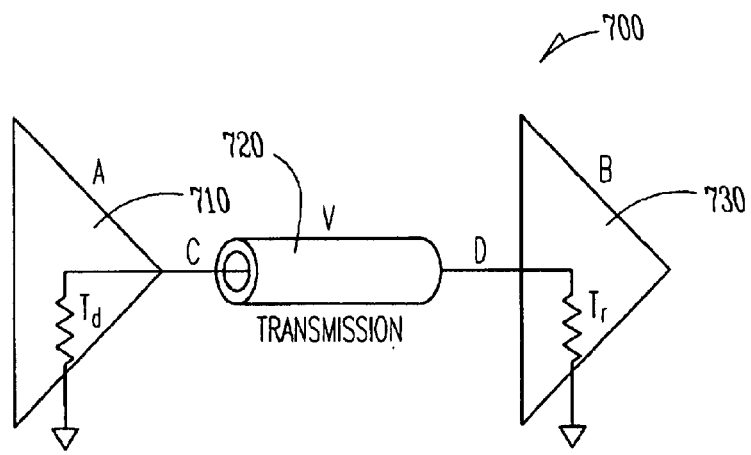
FIG. 7 illustrates a schematic representation of the transmission line between a transmitting device and a receiving device according to an embodiment of the present invention.

FIG. 7 illustrates a schematic representation of a transmission line (transmission cable) 720 between an example driver device 710 and an example receiver device 730 according to an embodiment of the present invention. Specifically, FIG. 7 shows an interaction between the interface logic 530 (FIG. 6) of the hardware model 350 (FIG. 6) and the test bench 340 (FIG. 6), via a transmission line 540 (FIG. 6). The interface logic 530 (FIG. 6) may serve as either the driver device "A" 710 or the receiver device "B" 730. Conversely, the test bench 340 may serve as either the receiver device "B" 730 or the driver device "A" 710. The transmission line 720 as represented in FIG. 7 may correspond to the transmission line 540 as represented in FIG. 6. As shown in FIG. 7, device "A" 710 and device "B" 730 represent the hardware model 350B of the reflected wave phenomenon utilized for functional validation purposes. In this reflected wave modeling technique, a VHDL enumerated type consisting of 6 possible values, known as a value set, (in this example 1, 0, Y, X, Z and R) may be declared with the representative meanings shown in TABLE 1 below.

TABLE 1

Definition of Enumerated Type Values

Value Abstract Meaning:

1  Transmission of a positive voltage value relative to ground.
0  Transmission of a voltage value equal to that of the reference ground.
Y  Indication of missing termination while a "0" is being transmitted.
X  Contentious state wherein two drivers are forcing opposite signal values (i.e., "1" and "0").
Z  No value is being driven.
R  Indication of a reflected wave in the presence of mismatched termination and a transmitted value of "1".

As shown in TABLE 1, there are 6 kinds of VHDL data types which define a value set:

(1) "1" represents a logic one, or true condition which indicates the transmission of a positive voltage value relative to ground.

(2) "0" represents a logic zero, or-false condition which indicates the transmission of a voltage value equal to that of the reference ground.

(3) "Y" represents a logic value which indicates missing termination while a logic "0" is being transmitted.

(4) "X" represents a logic value which indicates a contentious state where in two devices are forcing opposite signal values (i.e., "1" and "0").

(5) "Z" represents a logic value which indicates that no value is being driven.

(6) "R" represents a logic value which indicates a reflected wave in the presence of mismatched termination and a transmitted value of "1".

The VHDL enumerated type values (1, 0, Y, X, Z and R) may be arbitrarily selected but must be unique in representing what would be analog representations of the reflected wave phenomenon in a continuous time function.

A simulation resolution function may then be created using the properties shown in the matrix of TABLE 2 below.

TABLE 2

Enumerated Type Resolution Matrix

|   | 1 | 0 | Y | X | Z |
|---|---|---|---|---|---|
| 1 | 1 | X | R | X | 1 |
| 0 | X | 0 | Y | X | 0 |
| Y | R | Y | Y | X | Y |
| X | X | X | X | X | X |
| Z | 1 | 0 | Y | X | Z |

The matrix shown in TABLE 2 provides resolved values based on simulation values that the driver device "A" 710 or the receiver device "B" 730 are driven onto the transmission line 720. Simulation values (1, 0, Y, X, Z and R) of either the driver device 710 "A" or the receiver device 730 "B" are represented in the first row and column. Resolved values of the transmission line 720 are represented in the matrix. For example, if the driver device 710 "A" is transmitting a logic "1" that is a positive voltage value relative to ground, and the receiver device 730 "B" is also transmitting a logic "1", then the resolved value is a logic "1" as shown in TABLE 2. Likewise, if the driver device 710 "A" is transmitting a logic "0" that is a voltage value equal to that of the reference ground, and the receiver device 730 "B" is transmitting a logic "1", then the resolved value is "X" as shown in TABLE 2 indicating a contentious state where two drivers are forcing opposite values.

A complete description of matrix entries may be described as follows:

1—1: Both the driver device ("A" or "B") and the receiver device ("B" or "A") of a reflected wave phenomenon are transmitting a positive voltage relative to ground. The resolved value is a "1".

1-0: The driver device ("A" or "B") and the receiver device ("B" or "A") are driving the transmission line to opposing voltages. The resolved value is contention "X".

1-Y: The driver/receiver device is driving a positive voltage and the receiver/driver device is indicating a disconnect. The resolved value is a reflection on the transmission line "R".

1-Z: The driver/receiver device is sending a positive voltage and the receiver/driver device is indicating a tri-state condition. This condition will result in a "1".

0—0: The driver device ("A" or "B") and the receiver device ("B" or "A") are transmitting a voltage equal to that of the reference ground. The resolved value is the reference ground "0".

0-Y: The driver/receiver device is sending a voltage equal to that of the reference ground and the receiver/driver device is indicating it is disconnected. The resolved value is "0".

0-Z: The driver/receiver device is sending a voltage equal to that of the reference ground and the receiver/driver device is indicating a tri-state condition will result in a resolve value of "0".

Y—Y: This is the case where the both the driver device ("A" or B") and the receiver device ("B" or "A") are indicating disconnection. The resolved value is a "Y".

Y-Z: This is the case where the receiver/driver device is indicating a disconnect and the driver/receiver device is indicating a tri-state condition. The resolved value is a "Y".

Z—Z: Both the receiver device ("B" or "A") and the driver device ("B" or "A") are indicating a tri-state condition. The resolved value is a tri-state condition "Z".

X-Any value: Contention combined with any other value on the transmission wire resolves to contention.

According to the reflected wave phenomenon, there are two possible simulation conditions:

(1) Driver impedance $T_d$=Receiver impedance $T_r$: This is the case where a receiver device 730 is present and properly terminated on the opposite end of the transmission cable 720.

In this condition, the model of the driver device 710 "A" drives a simulation value at point C of a "1" or a "0" onto the transmission line 720. In the physical world this driver device 710 would have an intrinsic termination resistance of value $T_d$. The simulation model of the receiver device 730 "B" at the other end of the transmission line 720 has a physical internal termination resistance $T_r$ equal to $T_d$ and drives a simulation value of "Z" onto the transmission line 720 at point D. In the physical world this scenario results in no reflected wave on the transmission line 720.

The resolution function in this abstracted simulation model described in TABLE 2 will then resolve the simulation values of 1/Z into "1" and 0/Z into "0" representing no reflected wave. The abstract equivalent of the electrical result.

(2) Receiver Impedance $T_r$=Infinite: This is the case where the receiver device 730 is not present and therefore proper termination is not present on the opposite end of the transmission line 720.

In this condition, the model of the receiver device 730 "B" drives a simulation value of "Y" onto the cable at point D to represent the absence of termination resistance $T_r$. While the driver device 710 "A" drives a value of "0" on the transmission line 720 at point C, the resolution function of TABLE 2 indicates that the simulation resolve "V" on the transmission cable 720 will resolve to a simulation value "Y." While the driver device 710 "A" drives a value "1" onto the transmission line 720 at point C. The resolution function of TABLE 2 indicates that the simulation resolve "V" on the transmission line 720 will resolve to a simulation value "R", representing the equivalent of a reflected wave on the transmission line 720 and thus the abstract equivalent of the reflected wave phenomenon.

FIGS. 8A–8C and 9A–9C illustrate example analog and digital simulation results in the event where the physical internal termination resistance Tr is and is not present according to an embodiment of the present invention. The analog vs. simulation values as shown in FIGS. 8A–8C and FIGS. 9A–9C are intended to facilitate the understanding of the reflected waveforms on the transmission line (transmission cable) 720. If an analog simulator is utilized in lieu of the digital simulator shown in FIGS. 3–4 to show a reflected wave phenomenon in a continuous time function, analog representations of the reflected wave phenomenon for functional validation purposes may be shown in FIGS. 8A–8B and FIGS. 9A–9B.

Figure 8A:
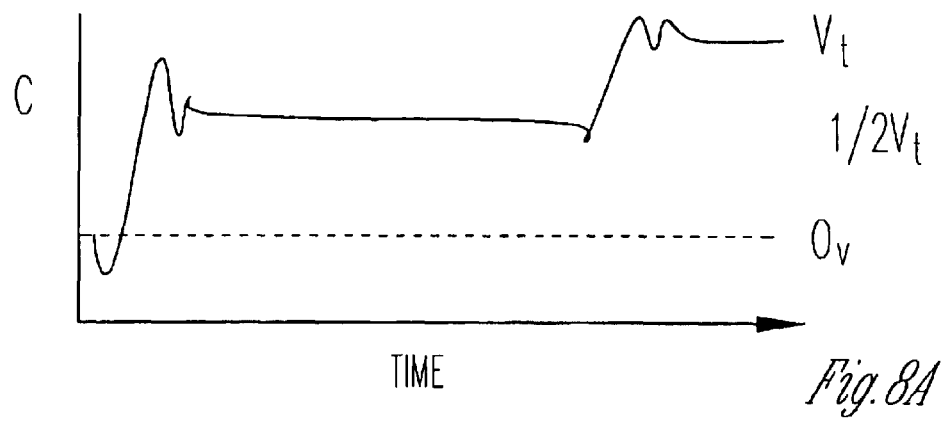
FIGS. 8A–8C illustrate example analog and digital simulation results in the event where the physical internal termination resistance Tr is not present according to an embodiment of the present invention.
Figure 8B:
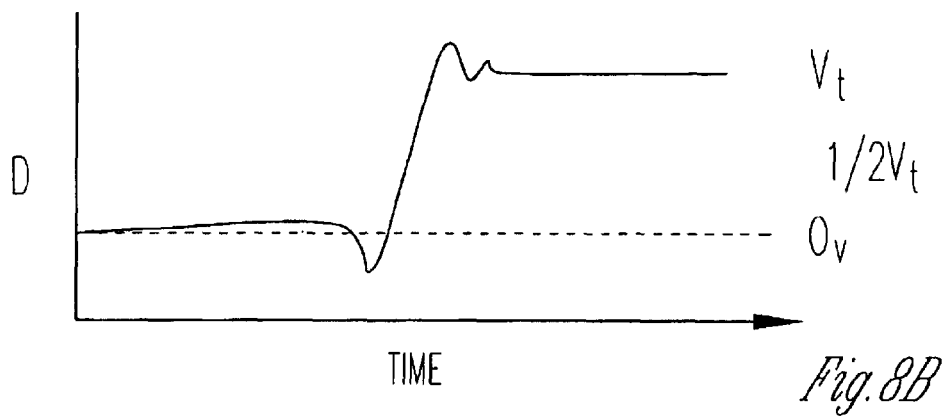

More specifically, FIGS. 8A–8B show analog simulation values of an electrical wave (waveform) at points C and D (as described with reference to FIG. 7) in the case where the receiver termination is not present on the transmission line (Tr=infinite). As represented in waveform traces, the signal originating at point C will bounce off of the end of the transmission line (point D) 720 and reflect back to point C.

Figure 8C:
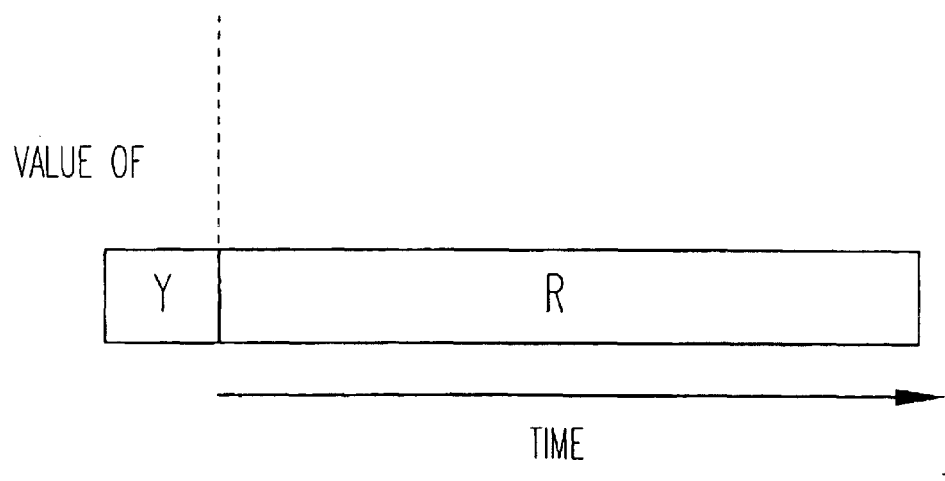

In the abstracted digital simulation case as shown in FIG. 8C, the simulation value on the transmission cable 720 "V" may represent a "Y" (intention to reflect as generated by receiver device 730 "B") before the driver device 710 "A" presents a voltage on the transmission wire. Once the voltage is presented, the analog reflection is represented in the digital simulation as an "R" using this reflected wave modeling technique and the enumerated type resolution matrix shown in TABLE 2. The digital simulation value of "Y" and "R" may be shown on the display device 12 of the computer-based simulation system shown in FIGS. 1–2.

Figure 9A:
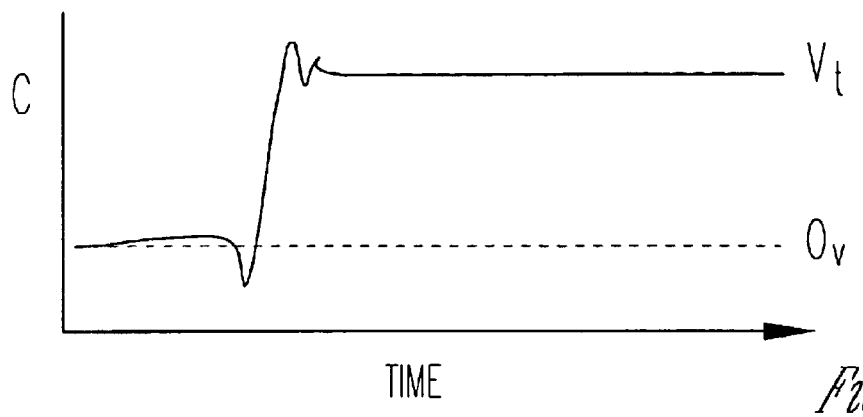
FIGS. 9A–9C illustrate example analog and digital simulation results in the event where the physical internal termination resistance Tr is present according to an embodiment of the present invention.
Figure 9B:
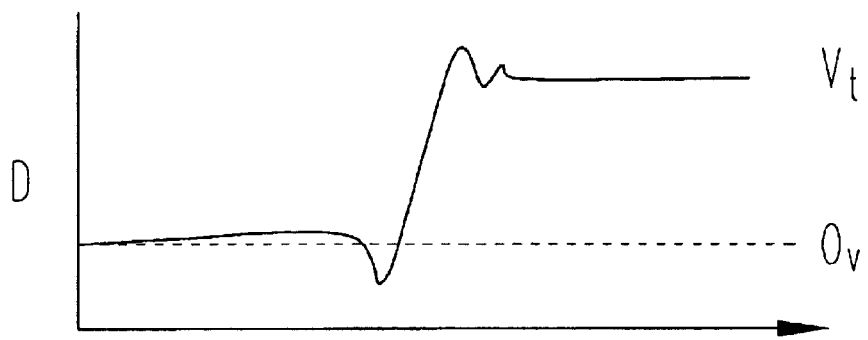

Likewise, FIGS. 9A–9B show the analog simulation values of an electrical wave (waveform) present at the same points © and D) in the cases there the receiver termination $T_r$ is present and matches $T_d$ (assuming an ideal transmission line). In this case, there is no reflected wave as shown in the analog simulation waveform.

Figure 9C:
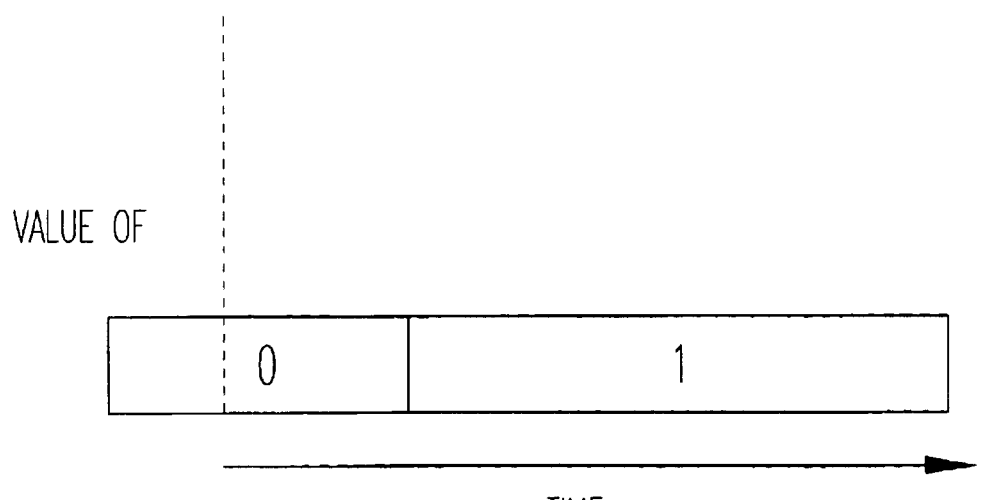

In the digital simulation as shown in FIG. 9C, the simulation value on the transmission line "V" (in FIG. 7) may represent a digital value of "0" until the driver device 710 "A" presents a voltage on the transmission wire. Once presented, the value on "V" is shown as a digital value of "1". The digital simulation value of "0" and "1" may be shown on the display device 12 of the computer-based simulation system shown in FIGS. 1–2.

As described from the foregoing, the present invention advantageously provides a method of representing the reflected wave phenomenon efficiently in a digital simulation for functional validation purposes. This reflected wave phenomenon has gone un-modeled in prior digital simulations. Simulations of protocols utilizing a physical layer that incorporated this phenomenon were typically limited to analog simulation environments. Using this method to represent reflected waves in a digital simulation enables efficient functional validation coverage of an analog property in a digital simulation environment where coverage was difficult to achieve using prior methods. In addition, this method has second order advantages that include simplified simulation interpretation and efficient use of digital simulations of the properties of interest (the transmission line reflections). The digital simulation solution offers a quantized evaluation of the reflected wave phenomenon that is compute-time efficient. Additionally, the behavior of interest to the digital world is preserved, allowing validation coverage of VHDL features that would have otherwise been poorly validated. Moreover, in a digital simulation, the actual voltage level on a wire at any given time is not necessarily known (nor is it required that it be known).

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention For example, the computer system as shown in FIGS. 1 and 2 may be configured differently or employ some or different components than those illustrated. In addition, the simulation system shown in FIGS. 3 and 4 may be configured differently or employ some or different components than those illustrated without changing the basic function of the invention. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A computer-based simulation system, comprising:
   a hardware model of a hardware interface having a transmission line;
   a test bench; and
   a simulator configured to simulate the operation of said hardware model based on said test bench for functional validation, including representing a reflected wave in a digital simulation to recognize the presence of a peripheral device at the opposite end of a transmission line.

2. The computer-based simulation system as claimed in claim 1, further comprising a simulation verifier configured to execute said test bench so as to verify the operational correctness and performance characteristics of said hardware model.

3. The computer-based simulation system as claimed in claim 1, wherein said hardware model, said test bench and said simulator correspond to a software module written using hardware description languages, and are provided on a computer tangible medium executable by a central processor for digital simulation and verification of the operation of said hardware model.

4. The computer-based simulation system as claimed in claim 1, wherein said hardware interface corresponds to a Universal Serial Bus (USB) interface.

5. The computer-based simulation system as claimed in claim 1, wherein said hardware model contains a schematic representation of a transmission line and end devices at opposite ends of the transmission line configured to determine whether an end device is present and properly terminated on the opposite end of the transmission line.

6. The computer-based simulation system as claimed in claim 5, wherein said hardware model is modeled in a hardware design language (HDL) with a data type represented in terms of "1, 0, Y, X, Z and R" wherein "1" represents a logic one, or true condition which indicates the transmission of a positive voltage value relative to ground; "0" represents a logic zero, or false condition which indicates the transmission of a voltage value equal to that of the reference ground; wherein "Y" represents a logic value which indicates missing termination while a logic "0" is being transmitted; wherein "X" represents a logic value which indicates a contentious state where end devices at opposite ends of the transmission line are forcing opposite signal values; wherein "Z" represents a logic value which indicates that no value is being driven on the transmission line; and wherein "R" represents a logic value which indicates a reflected wave in the presence of mismatched termination and a transmitted value of "1".

7. The computer-based simulation system as claimed in claim 6, wherein said hardware model is modeled with a simulation resolution function created using a matrix of the following properties:

|   | 1 | 0 | Y | X | Z |
|---|---|---|---|---|---|
| 1 | 1 | X | R | X | 1 |
| 0 | X | 0 | Y | X | 0 |
| Y | R | Y | Y | X | Y |
| X | X | X | X | X | X |
| Z | 1 | 0 | Y | X | Z | where:

1—1 indicates that both end devices of the transmission line are transmitting a positive voltage relative to ground from which a resolved value is "1";

1-0 indicates that both end devices of the transmission line are driving the transmission line to opposing voltages from which a resolved value is contention "X";

1-Y indicates that one end device is driving a positive voltage and the other end device is indicating a disconnect from which a resolved value is a reflection on the transmission line "R";

1-Z indicates that one end device is sending a positive voltage and the other end device is indicating a tri-state condition from which a resolved value is "1";

0—0 indicates that both end devices are transmitting a voltage equal to that of the reference ground from which a resolved value is "0";

0-Y indicates that one end device is sending a voltage equal to that of the reference ground and the other end device is indicating it is disconnected from which a resolved value is "0";

0-Z indicates that one end device is sending a voltage equal to that of the reference ground and the other end device is indicating a tri-state condition from which a resolve value is Y—Y indicates that both end devices are indicating disconnection from which a resolved value is "Y";

Y-Z indicates that one end device is indicating a disconnect and the other end device is indicating a tri-state condition from which a resolved value is "Y";

Z—Z indicates that both end devices are indicating a tri-state condition from which a resolved value is "Z"; and X-Any value indicates that a contention combined with any other value on the transmission line resolves to contention.

8. The computer-based simulation system as claimed in claim 6, wherein, when a receiving end device is present and thus properly terminated on the opposite end of the transmission line, a simulation model of a driving end device drives a simulation value of a logic "1" or a logic "0" onto the transmission line and a simulation model of a receiving end device drives a simulation value of "Z" onto the transmission line which resolve to simulation values of 1/Z into "1" and 0/Z into "0" representing no reflected wave.

9. The computer-based simulation system as claimed in claim 8, wherein, when a receiving end device is not present and thus proper termination is not present on the opposite end of the transmission line, a simulation model of the receiving end device drives a simulation value of "Y" onto the transmission line and a simulation model of the driving end device drives a simulation value of "1" on the transmission line which resolve to a simulation value "R", representing the equivalent of a reflected wave on the transmission line.

10. A computer readable medium having stored thereon a plurality of instructions which, when executed by a computer system, cause the computer system to:
   create a hardware model of a hardware interface having a transmission line;
   create a test bench; and
   simulate the operation of said hardware model based on said test bench for functional validation, including representing a reflected wave in a digital simulation to recognize the presence of a peripheral device at the opposite end of a transmission line.

11. The computer readable medium as claimed in claim 10, wherein said instructions which, when executed by the computer system, cause the computer system to further execute said test bench so as to verify the operational correctness and performance characteristics of said hardware model.

12. The computer readable medium as claimed in claim 10, wherein said hardware interface corresponds to a Universal Serial Bus (USB) interface.

13. The computer readable medium as claimed in claim 10, wherein said hardware model contains a schematic representation of a transmission line and end devices at opposite ends of the transmission line configured to determine whether an end device is present and properly terminated on the opposite end of the transmission line.

14. The computer readable medium as claimed in claim 13, wherein said hardware model is modeled in a hardware design language (HDL) with a data type represented in terms of "1, 0, Y, X, Z and R" wherein "1" represents a logic one, or true condition which indicates the transmission of a positive voltage value relative to ground; "0" represents a logic zero, or false condition which indicates the transmission of a voltage value equal to that of the reference ground; wherein "Y" represents a logic value which indicates missing termination while a logic "0" is being transmitted; wherein "X" represents a logic value which indicates a contentious state where end devices at opposite ends of the transmission line are forcing opposite signal values; wherein "Z" represents a logic value which indicates that no value is being driven on the transmission line; and wherein "R" represents a logic value which indicates a reflected wave in the presence of mismatched termination and a transmitted value of "1".

15. The computer readable medium as claimed in claim 14, wherein said hardware model is modeled with a simulation resolution function created using a matrix of the following properties:

|   | 1 | 0 | Y | X | Z |
|---|---|---|---|---|---|
| 1 | 1 | X | R | X | 1 |
| 0 | X | 0 | Y | X | 0 |
| Y | R | Y | Y | X | Y |
| X | X | X | X | X | X |
| Z | 1 | 0 | Y | X | Z | where:
- 1—1 indicates that both end devices of the transmission line are transmitting a positive voltage relative to ground from which a resolved value is "1";
- 1-0 indicates that both end devices of the transmission line are driving the transmission line to opposing voltages from which a resolved value is contention "X";
- 1-Y indicates that one end device is driving a positive voltage and the other end device is indicating a disconnect from which a resolved value is a reflection on the transmission line "R";
- 1-Z indicates that one end device is sending a positive voltage and the other end device is indicating a tri-state condition from which a resolved value is "1";
- 0—0 indicates that both end devices are transmitting a voltage equal to that of the reference ground from which a resolved value is "0";
- 0-Y indicates that one end device is sending a voltage equal to that of the reference ground and the other end device is indicating it is disconnected from which a resolved value is "0";
- 0-Z indicates that one end device is sending a voltage equal to that of the reference ground and the other end device is indicating a tri-state condition from which a resolve value is "0";
- Y—Y indicates that both end devices are indicating disconnection from which a resolved value is "Y";
- Y-Z indicates that one end device is indicating a disconnect and the other end device is indicating a tri-state condition from which a resolved value is "Y";
- Z—Z indicates that both end devices are indicating a tri-state condition from which a resolved value is "Z"; and
- X-Any value indicates that a contention combined with any other value on the transmission line resolves to contention.

16. The computer readable medium as claimed in claim 15, wherein, when a receiving end device is present and thus properly terminated on the opposite end of the transmission line, a simulation model of a driving end device drives a simulation value of a logic "1" or a logic "0" onto the transmission line and a simulation model of a receiving end device drives a simulation value of "Z" onto the transmission line which resolve to simulation values of 1/Z into "1" and 0/Z into "0" representing no reflected wave.

17. The computer readable medium as claimed in claim 16, wherein, when a receiving end device is not present and thus proper termination is not present on the opposite end of the transmission line, a simulation model of the receiving end device drives a simulation value of "Y" onto the transmission line and a simulation model of the driving end device drives a simulation value of "1" on the transmission line which resolve to a simulation value "R", representing the equivalent of a reflected wave on the transmission line.

18. A method of modeling a reflected wave in a digital simulation system, comprising:
- creating a hardware model of a hardware interface having a transmission line;
- creating a test bench; and
- simulating the operation of said hardware model based on said test bench for functional validation, including representing a reflected wave in a digital simulation to recognize the presence of a peripheral device at the opposite end of a transmission line.

19. The method as claimed in claim 18, further executing said test bench so as to verify the operational correctness and performance characteristics of said hardware model.

20. The method as claimed in claim 19, wherein said hardware interface corresponds to a Universal Serial Bus (USB) interface.

21. A computer-based simulation system comprising:
- a model of a hardware design, the model including software written in a hardware description language (HDL), the hardware design including hardware interfaces to a transmission line, the model including a representation of signal wave reflections on the transmission line;
- a test bench written in a HDL; and
- a digital simulator to exercise the test bench to verify functional correctness of the hardware design.

22. The system of claim 21, wherein the model of a hardware design further includes representing a reflected signal to verify recognition of a presence of a peripheral device at one end of the transmission line.

23. The system of claim 22, wherein the hardware interfaces to a transmission line include a Universal Serial Bus (USB).

24. The system of claim 23, wherein the model of a hardware design further includes a representation of transmission line signal reflections on a transmission cable.

25. The system of claim 21, wherein the model of a hardware design further includes a representation of protocol implementation logic of the hardware design and the test bench includes a representation of a standard communication protocol.

26. The system of claim 21, wherein the system includes a graphical user interface (GUI).

* * * * *